(12) United States Patent
Weems et al.

(10) Patent No.: US 11,202,394 B1
(45) Date of Patent: Dec. 14, 2021

(54) DATA CENTER COOLING SYSTEM

(71) Applicant: UIPCO, LLC, San Antonio, TX (US)

(72) Inventors: John Andrew Weems, San Antonio, TX (US); Raymond F. Martin, San Antonio, TX (US)

(73) Assignee: United Sendees Automobile Association (USAA), San Antonio, TX (US)

( * ) Notice: Subject to any disclaimer, the term of this patent is extended or adjusted under 35 U.S.C. 154(b) by 322 days.

(21) Appl. No.: 16/375,923

(22) Filed: Apr. 5, 2019

Related U.S. Application Data (60) Provisional application No. 62/751,492, filed on Oct. 26, 2018.

(51) Int. Cl.
*H05K 7/20* (2006.01)
*H05K 7/14* (2006.01)

(52) U.S. Cl.
CPC ....... *H05K 7/20818* (2013.01); *H05K 7/1488* (2013.01); *H05K 7/20327* (2013.01)

(58) Field of Classification Search
CPC ............. H05K 7/20818; H05K 7/1488; H05K 7/20327; H05K 7/20827
See application file for complete search history.

(56) References Cited

U.S. PATENT DOCUMENTS

| | | | | |
|---|---|---|---|---|
| 6,747,872 B1* | 6/2004 | Patel | ........................ | G06F 1/206 361/695 |
| 7,492,593 B2* | 2/2009 | Campbell | .......... | H05K 7/20754 165/104.33 |
| 8,113,009 B2* | 2/2012 | Kuriyama | .......... | H05K 7/20745 62/259.2 |
| 8,300,402 B2* | 10/2012 | Wei | ........................... | G06F 1/20 361/679.47 |
| 8,701,429 B2* | 4/2014 | Oki | ........................ | F24F 5/0035 62/181 |
| 9,839,163 B2* | 12/2017 | Keisling | ............ | H05K 7/20745 |
| 10,111,367 B2* | 10/2018 | Kodama | ............ | H05K 7/20236 |
| 10,356,949 B2* | 7/2019 | Pan | .................. | H05K 7/20309 |
| 10,772,238 B1* | 9/2020 | Ross | ...................... | H05K 7/208 |
| 2010/0248609 A1* | 9/2010 | Tresh | .................. | H05K 7/20745 454/184 |
| 2014/0190204 A1* | 7/2014 | Oki | ........................ | F24F 5/0035 62/513 |
| 2014/0260369 A1* | 9/2014 | LePoudre | ............... | F28D 15/00 62/91 |
| 2015/0351289 A1* | 12/2015 | Krietzman | ........... | H05K 7/1488 361/679.46 |
| 2016/0014933 A1* | 1/2016 | Matsunaga | ............. | B23P 19/00 361/679.53 |
| 2016/0037685 A1* | 2/2016 | Ross | .................. | H05K 7/20836 165/104.19 |

* cited by examiner

*Primary Examiner* — Jon T. Schermerhorn, Jr.
(74) *Attorney, Agent, or Firm* — Plumsea Law Group, LLC.

(57) ABSTRACT

A cooling system configured to remove heat from a chimney of a server cabinet. The system includes a first heat exchanger unit in the chimney of the server cabinet. The first heat exchanger has a fluid inlet for receiving a working fluid and a fluid outlet for discharging the working fluid. The first heat exchanger also has an upstream surface receiving waste heat generated by one or more servers and a downstream surface that discharges air cooled by the first heat exchanger. The upstream surface is generally perpendicular to the downstream surface.

20 Claims, 9 Drawing Sheets

DATA CENTER COOLING SYSTEM

CROSS-REFERENCE TO RELATED APPLICATIONS

This application claims the benefit of U.S. Provisional Patent Application Ser. No. 62/751,492, filed Oct. 26, 2018, for "Data Center Cooling System," naming Weems and Martin as inventors, the entirety of which is hereby incorporated by reference.

TECHNICAL FIELD

The present disclosure generally relates to cooling systems, and in particular, cooling systems for data centers.

BACKGROUND OF THE DISCLOSURE

Data centers generally house a large number of computer systems usually disposed on typical server racks. The computer systems generate a high quantity of heat that needs to be removed from the data center. The removal of this heat consumes a lot of power. About one third of the power consumed by a data center is for cooling.

One type of rack used in data centers is known broadly as a Chatsworth rack, available from Chatsworth Products Inc., Toronto, Canada. Various models of such racks are available. Information about such racks is available at www.chatsworth.com.

A standard cooling system often used in a data center delivers cool air to the front of a rack of servers or other IT equipment. This cool air is cooler than the outside air for most of the year in some data center locations. Warm air from the back of the rack is sent to an air handler to cool the air. The heat exchanged to the air handler is removed, typically by a chilled water system.

To improve separation of heated air from room air and reduce air handling requirements, server racks may be arranged in a specific way. Another typical arrangement is the use of a chimney system. A chimney system encloses the rear of a rack and provides a conduit for air heated by the IT equipment. The heated air then may be removed from the chimney, cooled by an air handler, and returned to the front of the server racks. The air in the chimney often is warmer than the outside air temperature or wet bulb temperature and is expensive to cool.

Therefore, there is a need in the art for a system and method that addresses the shortcomings of the prior art discussed above.

SUMMARY OF THE DISCLOSURE

In one aspect, the disclosure provides a cooling system configured to remove heat from a chimney of a server cabinet. The system comprises a first heat exchanger unit sized and configured for installation into the chimney of the server cabinet. The first heat exchanger has a fluid inlet for receiving a working fluid and a fluid outlet for discharging the working fluid. The first heat exchanger also has an upstream surface receiving waste heat generated by one or more servers and a downstream surface that discharges air cooled by the first heat exchanger. The upstream surface is generally perpendicular to the downstream surface.

In another aspect, the disclosure provides a cooling system for a data center. The system comprises a first cooling circuit configured to remove heat from a chimney of a server cabinet. The first cooling circuit includes a first heat exchanger sized and configured for installation into the chimney of the server cabinet. The first heat exchanger has a fluid inlet for receiving a working fluid and a fluid outlet for discharging the working fluid. The first cooling circuit pre-cools a portion of the heated air in the return air plenum.

The system also includes a second cooling circuit that receives heated air from a return air plenum, cools the heated air in an air handling unit, and conveys cool air to a supply air plenum.

In still another aspect, the disclosure provides a cooling system for a data center. The system includes a first cooling circuit configured to remove heat from a chimney having a door in an opening of a server cabinet. The first cooling circuit comprises a first heat exchanger sized and configured for installation into the chimney of the server cabinet. The first cooling circuit pre-cools a portion of the heated air in the return air plenum.

The first heat exchanger has a fluid inlet for receiving a working fluid and a fluid outlet for discharging the working fluid. The first heat exchanger is mounted to be reversibly removable from the chimney through the door opening without disconnecting the fluid inlet for receiving a working fluid and without disconnecting the fluid outlet for discharging the working fluid.

The cooling system also has a second cooling circuit that receives heated air from a return air plenum, cools the heated air in an air handling unit, and conveys cool air to a supply air plenum.

Other systems, methods, features, and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals identify substantially identical partnership.

DETAILED DESCRIPTION

Figure 1:
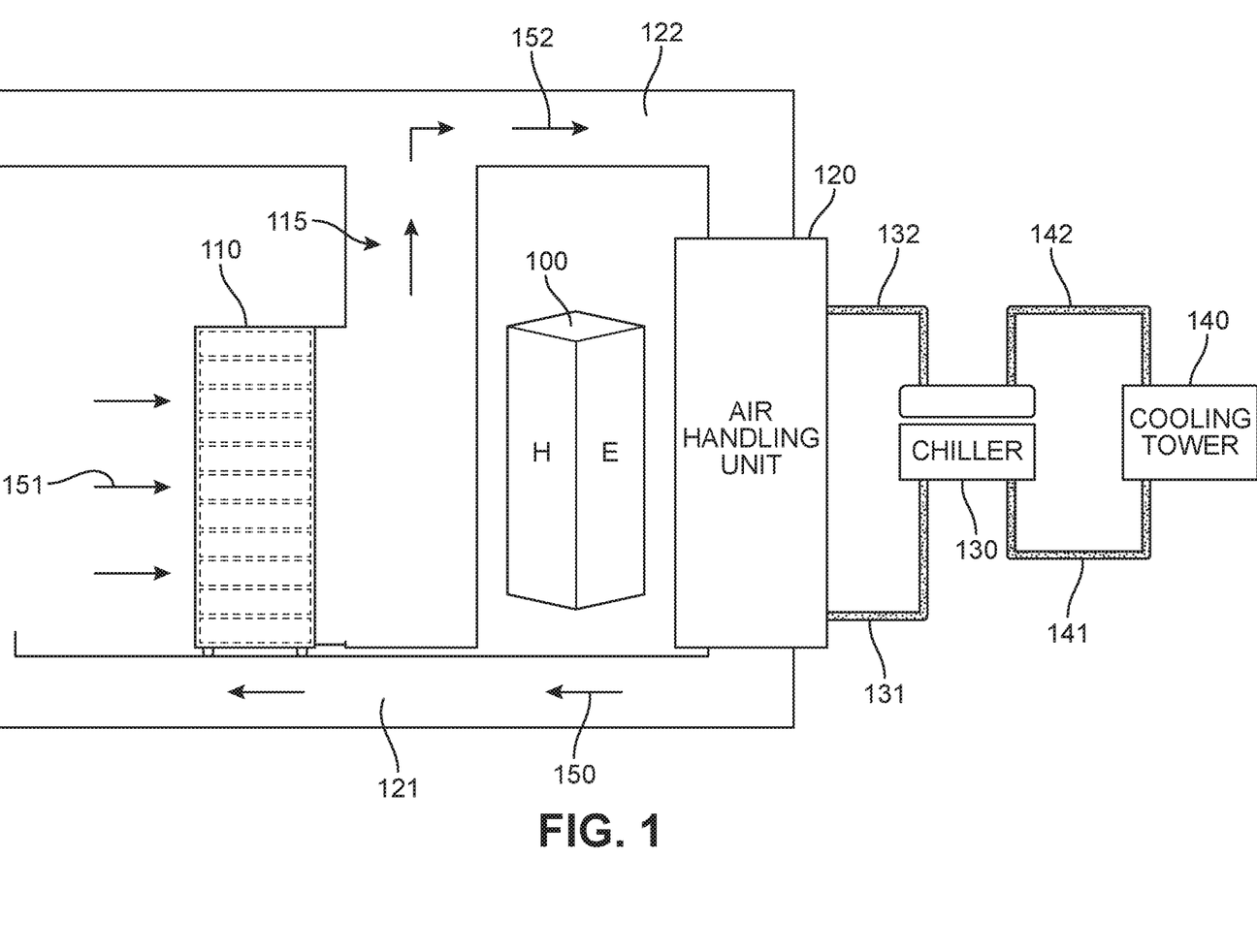
FIG. 1 is a schematic diagram of a typical data center air handling system.

Referring to FIG. 1, which illustrates a typical air handling regime in a data center, such centers typically include a source of cooled air in the form of a supply air plenum 121. The cooled air flowing in the direction of arrow 150 serves as the ambient air 151 that is made available to computer systems and servers 110 in the data center. Computer systems 110 generate heat and the cooled ambient air flowing in the direction of arrow 151 is heated by the computer systems. The computer systems have fans that direct the heated air to a chimney 115 disposed behind and downstream of the computer system. The heated air flowing in the direction of arrow 152 can be collected in a ceiling return air plenum 122. This heated air 152 is then conveyed to an air handling unit 120. Air handling unit 120 includes some kind of heat exchanger 100 to cool the air. The air handling unit is in thermal communication with a chiller 130 that removes heat from warm working fluid 132. The chiller then supplies cool fluid 131 to the air handling unit 120 and that air can be used to cool in incoming heated air 152 collected by the return air plenum 122. Warm fluid 132 is returned to chiller 130. After the air has been cooled, the air handling unit 120 can discharge this cool air into the supply air plenum 121, which returns cool air 151 to the data center. Heat is removed from the warm working fluid 132 from chiller 130 by cooling tower 140, where warm fluid 142 is cooled to produce cool fluid 141. This circulation of ambient air also can be considered a cycle.

In one aspect, the disclosure provides a cooling system configured to remove heat from a chimney of a server cabinet. The system also may be called a chimney cooling system. The system comprises a first heat exchanger unit sized and configured for installation into the chimney of the server cabinet. The first heat exchanger has a fluid inlet for receiving a working fluid and a fluid outlet for discharging the working fluid. The first heat exchanger also has an upstream surface receiving waste heat generated by one or more servers and a downstream surface that discharges air cooled by the first heat exchanger. The upstream surface is generally perpendicular to the downstream surface.

Figure 2:
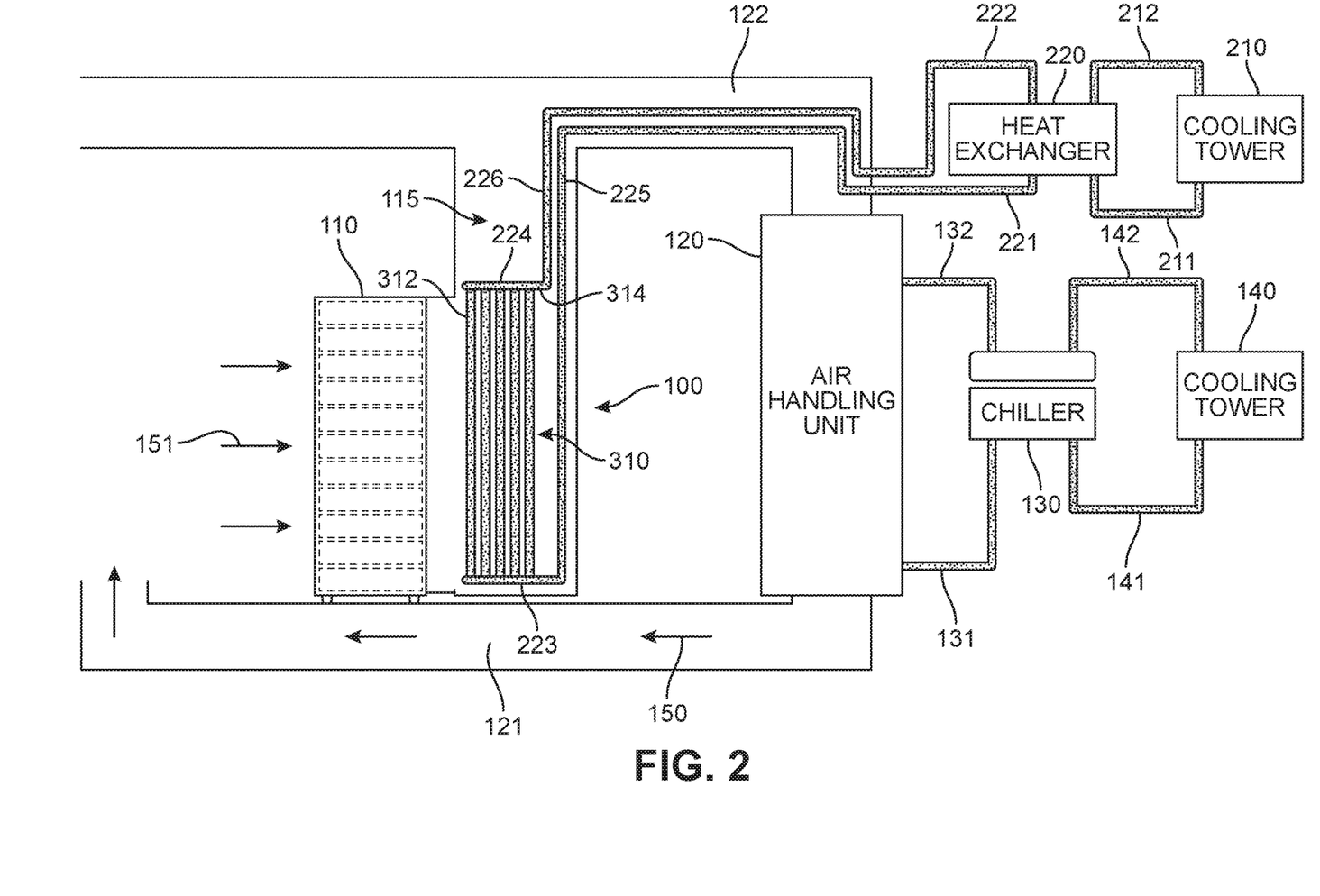
FIG. 2 is a schematic diagram of an embodiment of the disclosure.
Figure 3:
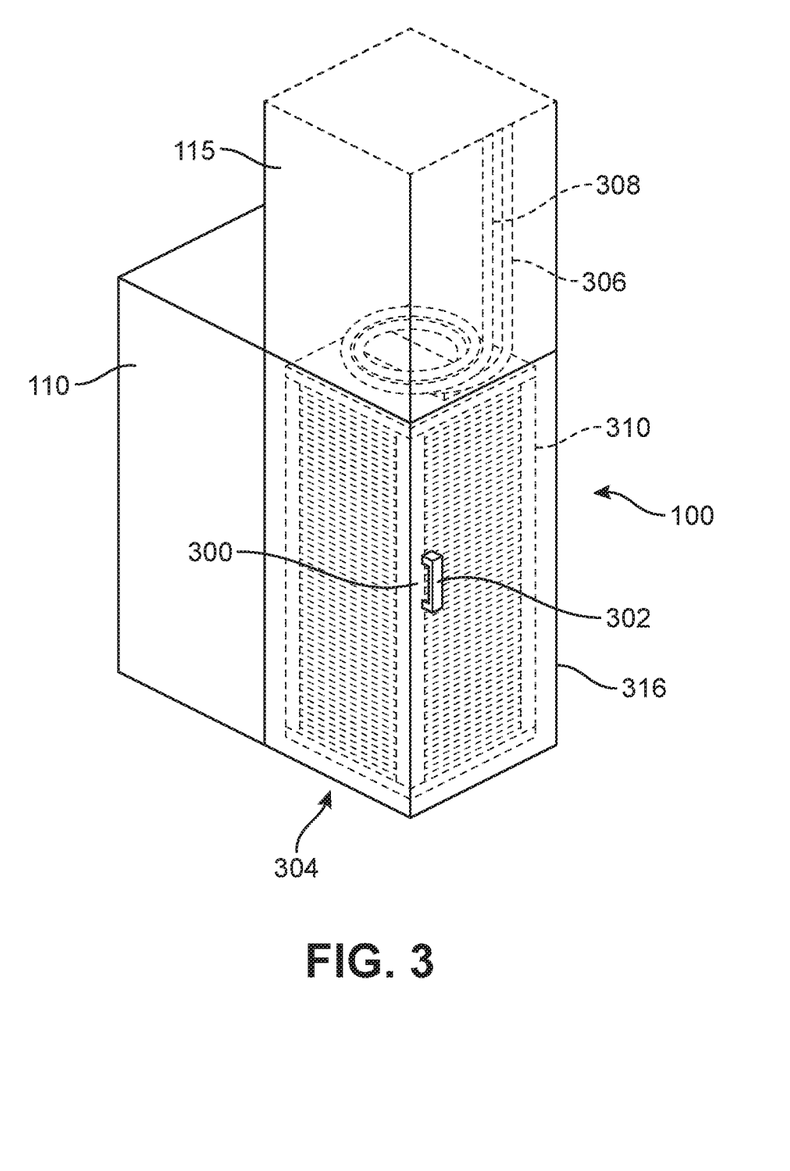
FIG. 3 is a schematic diagram of a heat exchanger in a data center chimney.

Referring to FIG. 2 and FIG. 3, an embodiment of a chimney cooling system 100 is shown. The chimney cooling system 100 includes a chimney heat exchanger 310 that is sized and configured to fit inside a chimney 115 of a server cabinet 304. Heated air that is located downstream of the servers 110 and disposed in the chimney 115 can be cooled by the chimney cooling system 100. The chimney heat exchanger 310 includes a fluid inlet 223 disposed at the bottom of the heat exchanger 310, and fluid outlet 224 disposed at the top of the heat exchanger. In this embodiment, working fluid flows concurrently with heated air.

Any suitable fluid may be used as the working fluid for chimney heat exchanger 310, which also is called the first heat exchanger. Any fluid capable of transferring heat in the temperature ranges present in the system may be used. Different embodiments may use water or different kinds of refrigerant. In one embodiment, refrigerant R-410A may be used. In another embodiment, ammonia refrigerant may be used as working fluid.

From the outlet 224 of the chimney heat exchanger 310, the working fluid is conveyed to a second heat exchanger 220 in concurrent flow embodiments. In concurrent flow, pipe 226 carries hot working fluid to second heat exchanger 220 through port 222. Working fluid from the chimney heat exchanger 310 may be cooled in second heat exchanger 220. In some cases, this second heat exchanger 220 is in thermal communication with a cooling tower 210. Cooled working fluid from the second heat exchanger 220 is returned by way of port 221 and through pipe 225 to the inlet 223 of the chimney heat exchanger. The cooled working fluid is distributed through the chimney heat exchanger 310 and the chimney heat exchanger removes heat generated by the computer systems or servers 110 disposed upstream. In some cases, these servers 110 are disposed in the server cabinet directly in front of the chimney heat exchanger 310. Heat is removed from heat exchanger 220 by causing warm working fluid to flow through pipe 212 to cooling tower 210. Pipe 211 carries cool working fluid to heat exchanger 220, where it is used to cool the working fluid for heat exchanger 310.

The chimney heat exchanger 310 includes an inlet surface 312 that faces the rear of the servers. This inlet surface 312 is generally disposed vertically. In contrast, the outlet surface 314 of the chimney heat exchanger 310 is generally disposed horizontally. In other words, as shown in FIG. 2, the air entering the chimney heat exchanger is the result of heating inlet airflow 151 and is generally travelling in a horizontal direction. And the air exiting the chimney heat exchanger is generally travelling in a vertical direction, as illustrated on FIG. 1. The chimney heat exchanger 310 is disposed at a bend as the heated air is being routed to the return air plenum 122.

Locating the chimney heat exchanger 310 in this location is advantageous for several reasons:

(1) the bend or change in direction of air flow can slow the mass flow rate of the air, thus allowing additional time for the heated air to interact with the chimney heat exchanger;

(2) the chimney cavity, and therefore the chimney heat exchanger, is much larger than a rear door type cooling system, which has coolers mounted on the rear door 300 (see FIG. 3). This larger size allows the chimney heat exchanger to present a much greater surface area to the heated air, thereby increasing the efficiency and the cooling capacity of the chimney heat exchanger over a rear door type cooling system.

In some embodiments, the working fluid can experience a phase change within the chimney heat exchanger. Generally, this phase change will be from a liquid to a gas, and will occur within the chimney heat exchanger 310. Chimney cooling systems that employ a phase change in the chimney heat exchanger can remove heat in proportion to the latent heat of vaporization or the heat associated with the enthalpy of vaporization of the working fluid. Typically, the heat of vaporization is large compared with the heat capacity of the working fluid liquid, so that a smaller amount of working fluid is required to remove the heat from the air than is required for a single-phase system. This can significantly improve the heat removal capacity of the chimney cooling system, or can be used to reduce the size of a system. Some embodiments can also be designed so that the working fluid experiences a second phase change at the second heat exchanger. This second phase change can be from a gas to a liquid in a condensation stage.

The chimney cooling system can be designed to be partially passive or completely passive. A completely passive system would not require a pump or blower to circulate the working fluid to and from the chimney heat exchanger to the second heat exchanger. Proper design using the right pressure, working fluid, and possibly gravitational height differences between the chimney heat exchanger and the second heat exchanger can result in a fully passive system that would not require a pump or blower. Some partially passive systems can use a low capacity pump or blower to assist in circulating the working fluid.

In embodiment of the disclosure, chimney heat exchanger 310 is operated in a concurrent flow regime. This flow arrangement is particularly suitable for a two-phase system.

In some embodiment of the disclosure, chimney heat exchanger 310 may be operated in a countercurrent regime. In such embodiments, which are particularly suitable for single-phase systems, cool working fluid flows through pipe 226 and enters chimney heat exchanger 310 at port 224. Working fluid then flows downwardly and exits chimney heat exchanger 310 through port 223. Warm working fluid then is returned to second heat exchanger 220 through port 221.

As shown in FIG. 2, the chimney cooling system 100 can be part of a multi-circuit cooling system for the data center. The chimney cooling system 100 can provide an initial temperature drop to the heated air 152 just downstream of the servers. After being treated by the chimney cooling system 100, the air can then be fed into the return air plenum 121 for treatment by another cooling system circuit using the air handling unit and its associated chiller.

In another aspect, the disclosure provides a cooling system for a data center. The system comprises a first cooling circuit configured to remove heat from a chimney 115 of a server cabinet 304, as shown on FIG. 2 and FIG. 3. The first cooling circuit includes a first heat exchanger 310 sized and configured for installation into the chimney 115 of the server cabinet 304. The first heat exchanger 310 has a fluid inlet 223 for receiving a working fluid and a fluid outlet 224 for discharging the working fluid. The first cooling circuit pre-cools a portion of the heated air 152 in the return air plenum 122.

The system also includes a second cooling circuit that receives heated air from a return air plenum 122, cools the heated air in an air handling unit 120, and conveys cool air to a supply air plenum 121. Air handling unit 120 exchanges heat from air flow 152 to a coolant in air handling unit 120. The fluid flow 132, which is warm, is cooled in chiller 130 and returned to cool air in the air handling unit as cold fluid flow 131.

Heat is removed from the air handling unit working fluid in cooling tower 140. Warm fluid 142 flows to cooling tower 140, and cool fluid is retuned to chiller 130 as fluid 141.

In still another aspect, the disclosure provides a cooling system for a data center. As shown in FIG. 3, the system 100 includes a first cooling circuit configured to remove heat from a chimney 115 having a door 300 in an opening 316 of a server cabinet. The first cooling circuit comprises a first heat exchanger 310 sized and configured for installation into the chimney 115 of the server cabinet 304. The first cooling circuit pre-cools a portion of the heated air in the return air plenum 122.

First heat exchanger 310 has a fluid inlet 223 for receiving a working fluid and a fluid outlet 224 for discharging the working fluid. First heat exchanger 310 is mounted to be non-destructibly and reversibly removable from chimney 115 through door opening 316 without disconnecting the fluid inlet for receiving cool working fluid from port 223 by way of hose 306, and without disconnecting the fluid outlet for discharging the working fluid through port 224 by way of hose 308.

The system also includes a second cooling circuit that receives heated air from a return air plenum 122, cools the heated air in an air handling unit 120, and conveys cool air to a supply air plenum 121.

Figure 4:
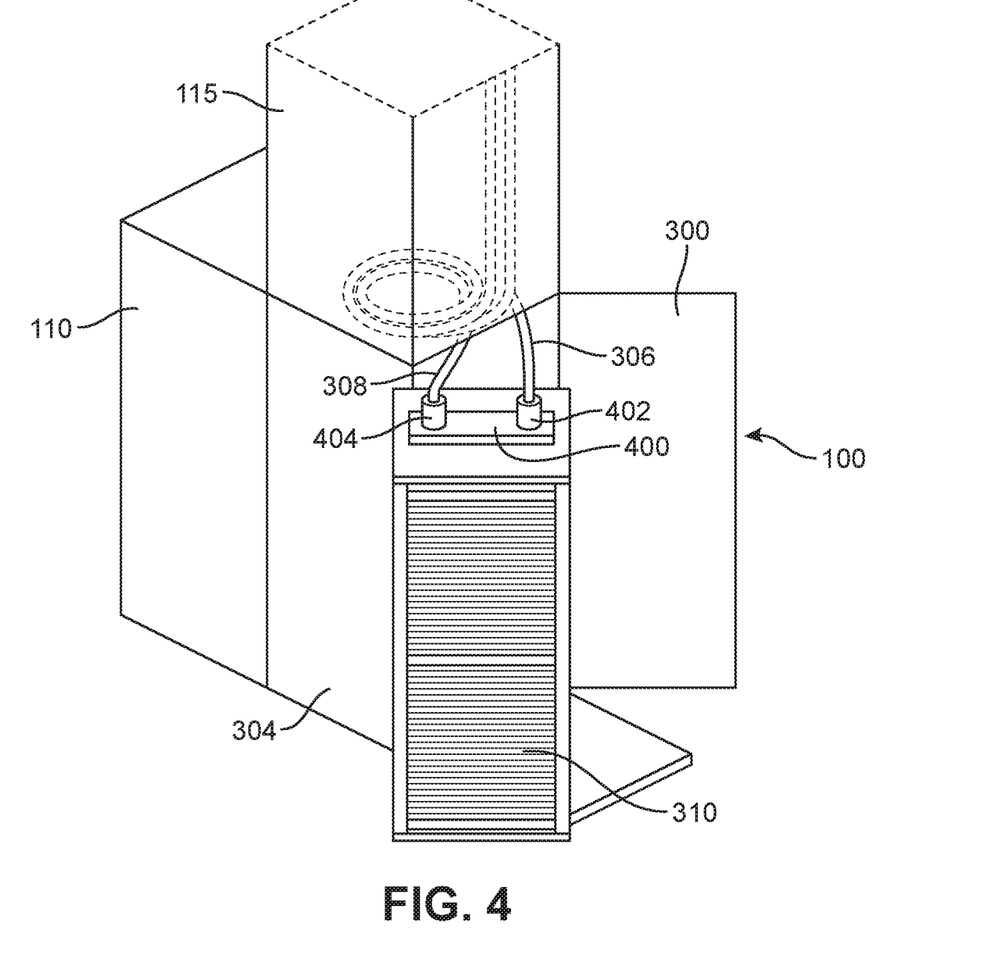
FIG. 4 is a schematic diagram of an embodiment of the disclosure.

Handle 302 on door 300 of cabinet 304 indicates which way door 300 pivots for access to chimney 115. As shown in FIG. 4, hose 308 is connected to first connector 404 and hose 306 is connected to second connector 402. First connector 404 and second connector 402 are mounted on connector base plate 400 for convenience. Base plate is mounted on chimney heat exchanger 310. Thus, working fluid flows to heat exchanger 310 through first connector 404 and second connector 402.

FIG. 4 illustrates features of some embodiments, in which heat exchanger 310 is non-destructibly and reversibly removable from cabinet 304. In embodiments illustrated in FIG. 4, heat exchanger 310 is mounted so that it can be completely removed from the chimney through opening 316 when door 300 is open. Heat exchanger 310 is completely removed from cabinet 304 and pivoted in the direction opposite the direction the door 300, as shown on FIG. 4. This arrangement for these features makes it possible to access the door opening 316 completely unencumbered by door 300 and to non-destructibly and completely remove heat exchanger 310 from chimney 115 without disconnecting heat exchanger 310 from chimney cooling system 100.

Figure 5:
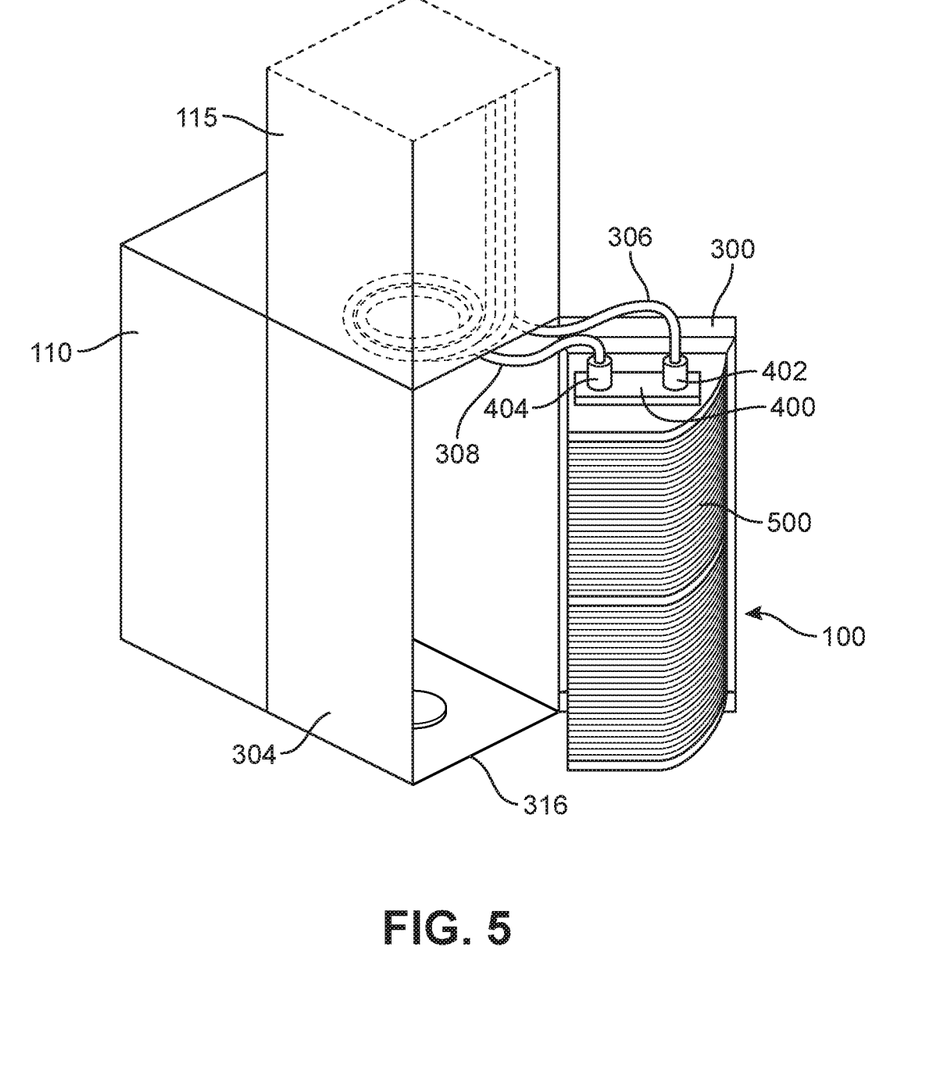
FIG. 5 is a schematic diagram of another embodiment of the disclosure.

In other embodiments, first heat exchanger, or chimney heat exchanger, 500 may be mounted on the inside surface of door 300, as illustrated in FIG. 5. As illustrated, in system 100, cabinet 304 includes door opening into which door 304 enters or abuts to close the cabinet. First hose 308 is connected to first connector 404 and second hose 306 is connected to second connector 402. First connector 404 and second connector 402 are mounted on connector base plate 400 for convenience. First connector 404 and second connector 402 may contain valves or other methods to seal the working fluid into first hose 308 and second hose 306. First connector 404 and second connector 402 also may seal the heat exchanger connections. Base plate is mounted on chimney heat exchanger 310. Thus, working fluid flows to heat exchanger 310 through first connector 404 and second connector 402.

As shown in FIG. 5, chimney heat exchanger 500 is curved on the side of the door opposite the hinge. This curve is necessary to make it possible to open door 300 and to pivot heat exchanger 500 to be completely clear of the cabinet 304 for ease of access.

In some embodiments, heat exchanger 310 is a tube-and-fin heat exchanger. As illustrated at 600 in FIG. 6, heat exchanger 600 comprises an array of tube-and-fin assemblies comprising tube 604 and radiating fins 602. In some embodiments, the tube-and-fin assemblies are arranged vertically, as at 600. In some embodiments, the tube-and-fin heat assemblies may be arranged horizontally, as illustrated in FIG. 7. Working fluid flows through tube 702, and radiating fins 704 extend into the air flow to cool the air.

Figure 6:
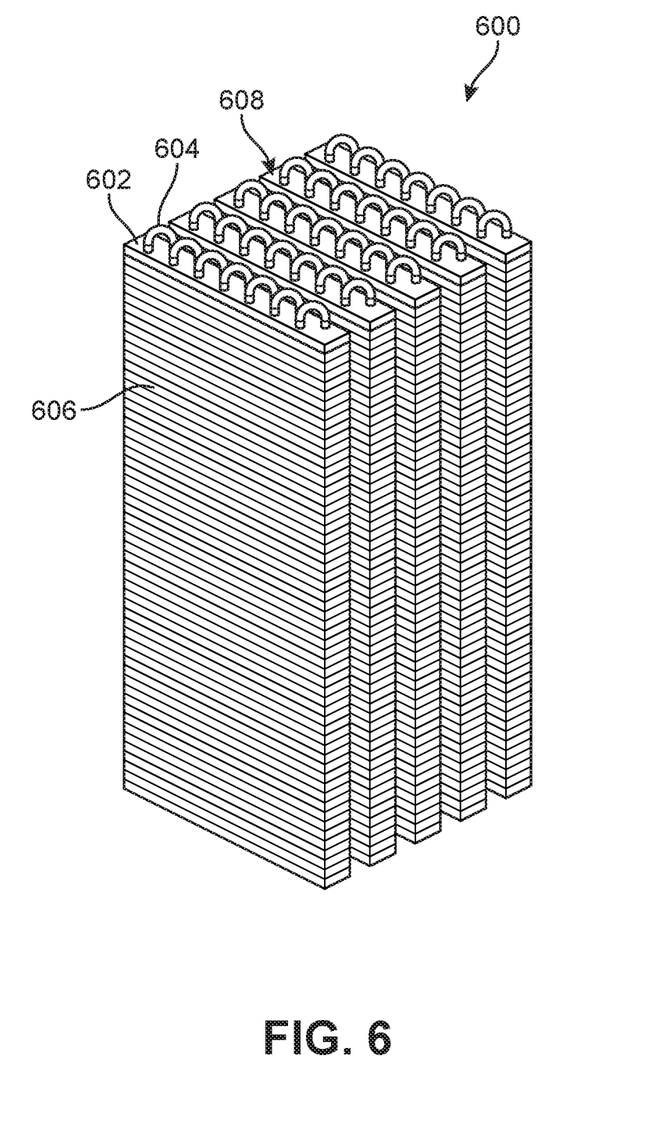
FIG. 6 is a schematic diagram of an embodiment of a heat exchanger of the disclosure.
Figure 7:
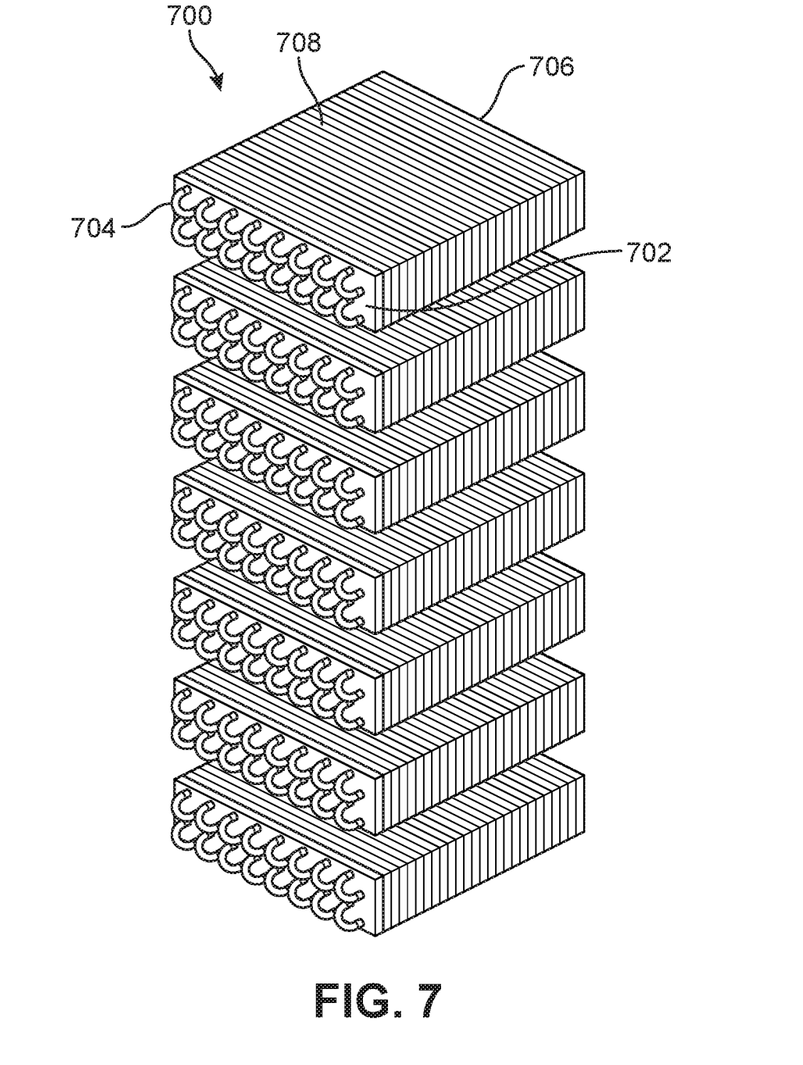
FIG. 7 is a schematic diagram of another embodiment of a heat exchanger of the disclosure.

A difference between the embodiments that are horizontal, as in FIG. 6, and embodiments that are horizontal, as in FIG. 7, is highlighted by a difference between these figures. In FIG. 6, surface 606 is inlet surface 312, and surface 608, which extends across the end area of the tube-and-fin elements, is outlet surface 314. Thus, as can be seen, air flows into and through the fins of the first element and past tubes 604, which are arranged vertically. Air will rise in the space between tube-and-fin elements and flow out through outlet area 608.

In other embodiments, such as an embodiment illustrated in FIG. 7, surface 706 at the ends of the tube-and-fin elements, which cannot be seen in FIG. 7, is the inlet surface 312. Surface 708 is outlet surface 314. Thus, air to be cooled flows over the ends of the tube-and-fin elements and flows out between the fins on element closest to the fluid exit in exit surface 314.

Figure 8:
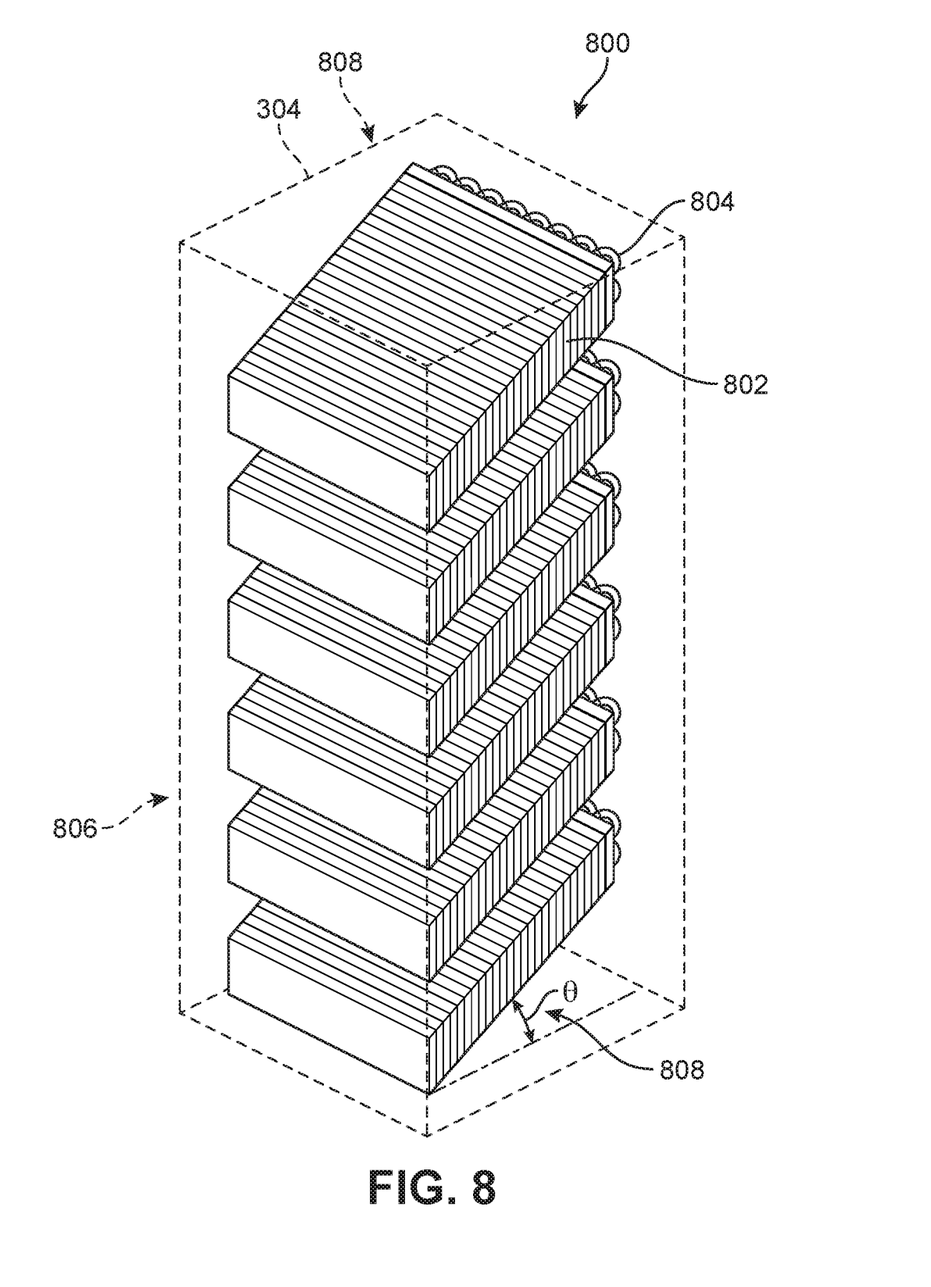
FIG. 8 is a schematic diagram of yet another embodiment of a heat exchanger of the disclosure.

In still another embodiment, such as illustrated in FIG. 8, the tube-and-fin assemblies may be arranged at an angle θ 810 from horizontal. Working fluid flows in tube 802. Radiators 804 not only aid heat transfer, but also tend to urge the air to flow upward within chimney 115. Typically, angle θ is between about 5° and about 40°, typically between about 10° and about 30°, and more typically between about 15° and about 25°.

Figure 9:
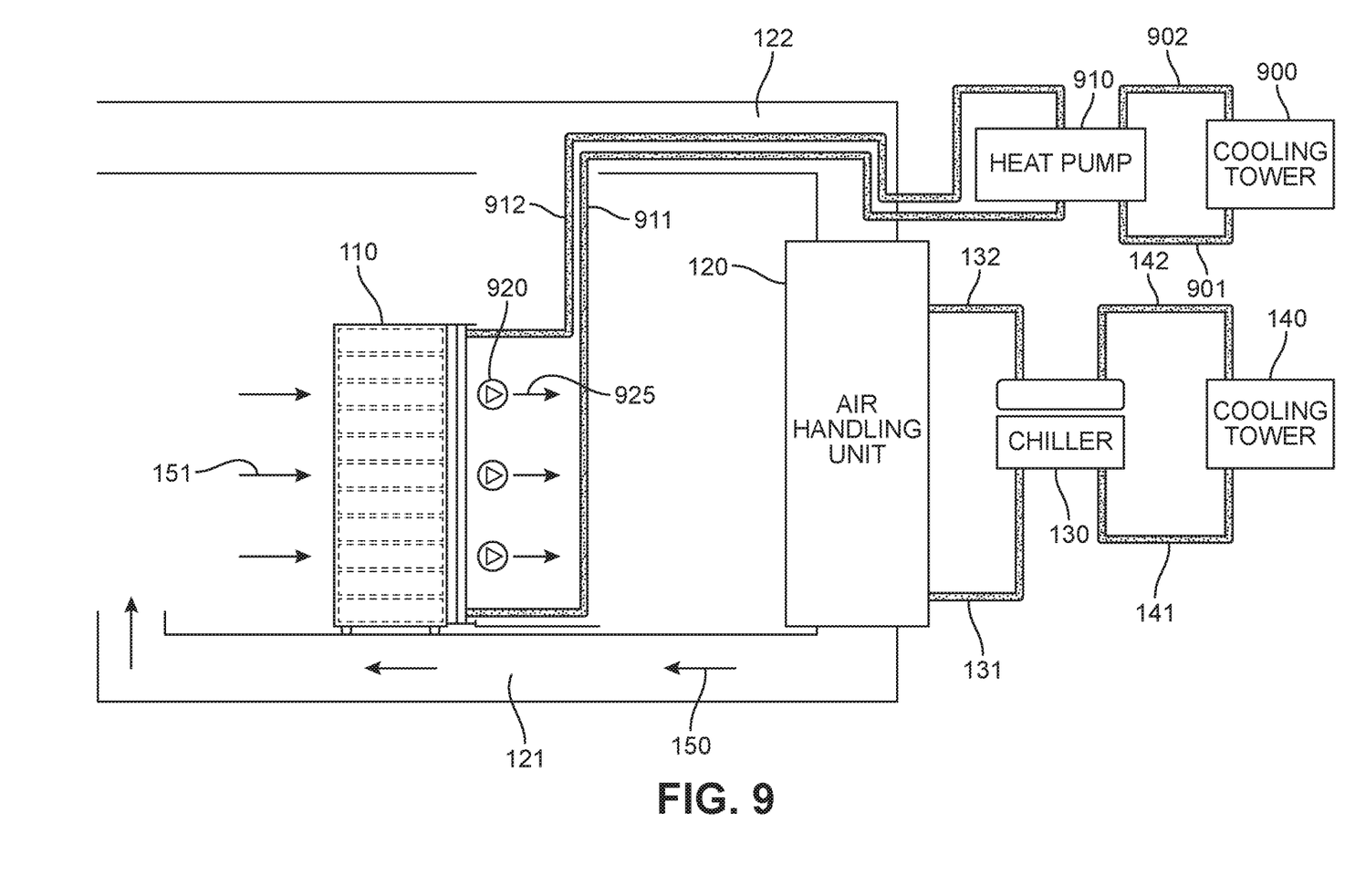
FIG. 9 is a schematic diagram of another embodiment of the disclosure.

FIG. 9 illustrates use of embodiments of a cooling system that combines elements of known coolers with embodiments of the disclosure. FIG. 9 illustrates air handling unit 120 providing cooled air 150 through plenum 121, yielding air 151 to cool servers 110. The air handling unit 120 receives warm air from plenum 122. Chiller 130 and cooling tower 140 serve as described above.

Fan 920 illustrates a known system wherein air is drawn over a cooling surface and is urged in the direction of direction arrow 925, and then to plenum 122. In some embodiments, a system wherein a working fluid is circulated from the cooling surface through pipe 912 to heat pump 910, where the fluid is cooled and returned to the cooling surface through pipe 911.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A cooling system configured to remove heat from a chimney of a server cabinet comprising:
   a first heat exchanger unit disposed in the chimney of the server cabinet;
   the first heat exchanger having a fluid inlet for receiving a working fluid, and a fluid outlet for discharging the working fluid; the first heat exchanger also having an upstream surface receiving waste heat generated by one or more servers; the first heat exchanger also having a downstream surface that discharges air cooled by the first heat exchanger;
   wherein the upstream surface is generally perpendicular to the downstream surface.

2. The cooling system according to claim 1, further comprising a second heat exchanger in thermal communication with a cooling tower.

3. The cooling system according to claim 1, wherein the working fluid is passively conveyed from the second heat exchanger to the first heat exchanger.

4. The cooling system according to claim 1, wherein the working fluid experiences a phase change from a liquid to a gas in the first heat exchanger.

5. The cooling system according to claim 4, wherein the working fluid experiences a second phase change from gas to liquid in the second heat exchanger.

6. The cooling system according to claim 1, wherein the fluid flow in the first heat exchanger is concurrent with the waste heat air flow.

7. The cooling system according to claim 1, wherein the fluid flow in the first heat exchanger is countercurrent with the waste heat air flow.

8. A cooling system for a data center comprising:
   a first cooling circuit configured to remove heat from a chimney of a server cabinet comprising:
   a first heat exchanger disposed in the chimney of the server cabinet;
   the first heat exchanger having a fluid inlet for receiving a working fluid, and a fluid outlet for discharging the working fluid;
   a second cooling circuit receiving heated air from a return air plenum, cooling the heated air in an air handling unit and conveying cool air to a supply air plenum;
   wherein the first cooling circuit pre-cools a portion of the heated air in the return air plenum.

9. The cooling system according to claim 8, wherein at one server is disposed between the supply air plenum and the first heat exchanger.

10. The cooling system according to claim 8, wherein the air handling unit of the second cooling circuit is in thermal communication with a chiller; wherein the chiller uses a second working fluid.

11. The cooling system according to claim 10, wherein the working fluid of the first heat exchanger is different than the second working fluid of the chiller.

12. The cooling system according to claim 11, wherein the first heat exchanger disposed in the chimney includes a generally vertical inlet surface and a generally horizontal outlet surface.

13. The cooling system according to claim 8, wherein the fluid flow in the first heat exchanger is concurrent with the waste heat air flow.

14. The cooling system according to claim 8, wherein the fluid flow in the first heat exchanger is countercurrent with the waste heat air flow.

15. A cooling system for a data center comprising:
   a first cooling circuit configured to remove heat from a chimney having a door in an opening of a server cabinet comprising:
   a first heat exchanger disposed in the chimney of the server cabinet;
   the first heat exchanger having a fluid inlet for receiving a working fluid, and a fluid outlet for discharging the working fluid;
   the first heat exchanger mounted to be reversibly removable from the chimney through the door opening without disconnecting the fluid inlet for receiving a working fluid and without disconnecting the fluid outlet for discharging the working fluid;
   a second cooling circuit receiving heated air from a return air plenum, cooling the heated air in an air handling unit and conveying cool air to a supply air plenum;
   wherein the first cooling circuit pre-cools a portion of the heated air in the return air plenum.

16. The cooling system according to claim 15, wherein the door pivots horizontally away from the chimney in a first direction.

17. The cooling system according to claim 16, wherein the first heat exchanger is mounted on the door.

18. The cooling system according to claim 16, wherein the first heat exchanger is mounted to be reversibly withdrawn from the chimney and rotated horizontally in a second direction opposite the first direction.

19. The cooling system according to claim 15, wherein the fluid flow in the first heat exchanger is concurrent with the waste heat air flow.

20. The cooling system according to claim 16, wherein the fluid flow in the first heat exchanger is countercurrent with the waste heat air flow.

* * * * *

UNITED STATES PATENT AND TRADEMARK OFFICE
CERTIFICATE OF CORRECTION

PATENT NO. : 11,202,394 B1  
APPLICATION NO. : 16/375923  
DATED : December 14, 2021  
INVENTOR(S) : Weems et al.

Page 1 of 1

It is certified that error appears in the above-identified patent and that said Letters Patent is hereby corrected as shown below:

On the Title Page

Item (73), In the Assignee:  
"United Sendees Automobile Association (USAA)"  
Should read:  
--United Services Automobile Association (USAA)--

Signed and Sealed this  
Fifteenth Day of March, 2022

Drew Hirshfeld  
*Performing the Functions and Duties of the*  
*Under Secretary of Commerce for Intellectual Property and*  
*Director of the United States Patent and Trademark Office*